United States Patent
Lim et al.

(10) Patent No.: US 10,826,151 B2
(45) Date of Patent: Nov. 3, 2020

(54) DIRECTIONAL COUPLER CIRCUIT AND POWER AMPLIFYING DEVICE WITH PHASE COMPENSATION FUNCTION

(71) Applicant: Samsung Electro-Mechanics Co., Ltd., Suwon-si (KR)

(72) Inventors: Jong Mo Lim, Suwon-si (KR); Yoo Sam Na, Suwon-si (KR); Hyun Hwan Yoo, Suwon-si (KR); Hyun Jin Yoo, Suwon-si (KR); Hyung Jun Cho, Suwon-si (KR); Yoo Hwan Kim, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 16/421,593

(22) Filed: May 24, 2019

(65) Prior Publication Data
US 2020/0119424 A1    Apr. 16, 2020

(30) Foreign Application Priority Data
Oct. 16, 2018   (KR) .......................... 10-2018-0123212

(51) Int. Cl.
*H01P 5/18* (2006.01)
(52) U.S. Cl.
CPC ....................... *H01P 5/18* (2013.01)
(58) Field of Classification Search
CPC .................. H01P 5/18; H01P 5/184
(Continued)

(56) References Cited

U.S. PATENT DOCUMENTS 8,289,102 B2 * 10/2012 Yamamoto .............. H01P 5/184
                                                          333/116
2005/0239421 A1   10/2005 Kim et al.
(Continued)

FOREIGN PATENT DOCUMENTS

JP        2005-312000 A      11/2005
KR      10-1084591 B1       11/2011
(Continued)

OTHER PUBLICATIONS

Chun, Young-Hoon, et al., "A Novel Microstrip Line Backward Directional Coupler with High Directivity", *IEEE*, 2004, pp. 1891-1894.
(Continued)

*Primary Examiner* — Dean O Takaoka
(74) *Attorney, Agent, or Firm* — NSIP Law

(57) ABSTRACT

A directional coupler circuit includes a signal line disposed between a first terminal and a second terminal; a coupling line comprising a first end terminal and a second end terminal, and disposed to be coupled to the signal line; a switching circuit connecting the first end terminal and a coupling port to each other to extract a first coupling signal in a first coupling mode, and connecting the second end terminal and the coupling port to extract a second coupling signal in a second coupling mode; and a phase compensating circuit configured to compensate for a phase difference between the coupling port and a first isolation port in the first coupling mode, or compensate for a phase difference between the coupling port and a second isolation port in the second coupling mode.

16 Claims, 13 Drawing Sheets

(58) Field of Classification Search
USPC .................................................. 333/109, 116
See application file for complete search history.

(56) References Cited

U.S. PATENT DOCUMENTS

| | | |
|---|---|---|
| 2010/0171564 A1 | 7/2010 | Yamamoto et al. |
| 2014/0266499 A1* | 9/2014 | Noe .......................... H01P 5/18 |
| | | 333/111 |
| 2017/0063425 A1* | 3/2017 | Khlat ........................ H01P 5/18 |
| 2017/0324392 A1* | 11/2017 | Srirattana ............... H01P 5/188 |

FOREIGN PATENT DOCUMENTS

| | | |
|---|---|---|
| KR | 10-2017-0093208 A | 8/2017 |
| WO | WO 2016/094376 A2 | 6/2016 |

OTHER PUBLICATIONS

Solomko, V., et al., "Tunable directional coupler for RF front-end applications", *Electronics Letters*, Nov. 2015, vol. 51, No. 24, pp. 2012-2014.
Korean Office Action dated Nov. 28, 2019 in counterpart Korean Patent Application No. 10-2018-0123212 (5 pages in English and 5 pages in Korean).

\* cited by examiner

DIRECTIONAL COUPLER CIRCUIT AND POWER AMPLIFYING DEVICE WITH PHASE COMPENSATION FUNCTION

CROSS-REFERENCE TO RELATED APPLICATION

This application claims the benefit under 35 USC § 119(a) of Korean Patent Application No. 10-2018-0123212 filed on Oct. 16, 2018 in the Korean Intellectual Property Office, the entire disclosure of which is incorporated herein by reference for all purposes.

BACKGROUND

1. Field

The following description relates to a directional coupler circuit and a power amplifying device with a phase compensation function.

2. Description of Related Art

Typically, a radio frequency (RF) front end module (FEM) may include a power amplifier (PA) and a power detector for controlling the power amplifier.

Typically, the power detector may be an isolator type or a directional coupler type. The directional coupler type is widely used because of its overall cost and ease of implementation.

Impedance of an antenna may actually be changed by various environments of a mobile communications device. Accordingly, an error may occur in detection of an output power of the power amplifier (PA) due to a reflected wave generated from the antenna. A coupler performance of high directivity may be needed to accurately detect an output level of the PA while significantly reducing an influence on the reflected wave generated from the antenna.

As an example of a typical coupler, a coupler applied to the front end module (FEM) may detect the magnitude of an output signal output from the PA to control the PA.

In this example, when the impedance of the antenna is changed at 50 ohms, a reflected wave is generated. The reflected wave may also adversely affect the output of the coupler. For example, since an output voltage of the coupler may include all of the components that are coupled by an output voltage of the power amplifier and a voltage by the reflected wave, a detected output level of the power amplifier may include error components due to the reflected wave. As a result, accuracy of detection may be lowered.

Meanwhile, the output power of the power amplifier may be accurately detected since an isolation level of a coupling voltage by the voltage due to the reflected wave may be lower than a coupling level of the coupling voltage by an output voltage Vp of the power amplifier. Here, a difference between the coupling level and the isolation level is known as directivity.

In addition, as communications modules become more miniaturized, efforts to turn the coupler into an integrated circuit (IC) increases, and the following problems may occur.

For example, in a coupler having a coupling line, there is a characteristic in which a coupling value increases as a frequency increases due to a parasitic capacitance between the signal line and the coupling line. Accordingly, in many coupler structures, a circuit having an electrical length corresponding to a specific wavelength may be used to implement a constant coupling value in a specific frequency range. As a size of a circuit becomes smaller than a wavelength by making the coupler circuit into an IC, it has become increasingly difficult to implement a coupler having a constant coupling value according to the frequency.

In addition, in the form of a module for mounting a silicon chip on a printed circuit board (PCB), directivity performance may deteriorate due to impedance mismatch according to an integrated structure, dielectric constant unbalance of a material around the coupler circuit, asymmetry of the coupler circuit, and the like.

Further, in an example of a multiband system that implements a plurality of frequency bands, the typical coupler may have a deficiency wherein a coupling amount may be changed when the frequency band is changed. In addition, the coupling amount may be changed due to a coupling influence by the reflected wave, and the detection accuracy by the coupling may be lowered. Accordingly, directivity characteristics of the coupler may deteriorate.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In a general aspect, a directional coupler circuit includes a signal line disposed between a first terminal and a second terminal, a coupling line including a first end terminal and a second end terminal, and configured to be coupled to the signal line, a switching circuit configured to connect the first end terminal and a coupling port to each other to extract a first coupling signal in a first coupling mode, and configured to connect the second end terminal and the coupling port to extract a second coupling signal in a second coupling mode, and a phase compensating circuit configured to compensate for a phase difference between the coupling port and a first isolation port in the first coupling mode, or compensate for a phase difference between the coupling port and a second isolation port in the second coupling mode.

The switching circuit may include a first switch connected between the first end terminal and the coupling port, a second switch connected between the second end terminal and the coupling port, a third switch connected between the first end terminal and the second isolation port, and a fourth switch connected between the second end terminal and the first isolation port.

The phase compensating circuit may include a first compensating circuit connected between the coupling port and the first isolation port and configured to compensate for the phase difference between the coupling port and the first isolation port in the first coupling mode, and a second compensating circuit connected between the coupling port and the second isolation port and configured to compensate for the phase difference between the coupling port and the second isolation port in the second coupling mode.

The first compensating circuit may include a first resistor and a first capacitor connected to each other in series between the coupling port and the first isolation port.

The first compensating circuit may further include a first ground resistor connected between the first isolation port and a first ground terminal.

The second compensating circuit may include a second resistor and a second capacitor connected to each other in series between the coupling port and the second isolation port.

The second compensating circuit may further include a second ground resistor connected between the second isolation port and a second ground terminal.

The phase compensating circuit may include a first ground capacitor connected between the coupling port and the second ground terminal, and a second ground capacitor connected between the coupling port and the first ground terminal.

In a general aspect, a power amplifying device includes a power amplifier, and a directional coupler circuit connected to an output terminal of the power amplifier, wherein the directional coupler circuit includes a signal line disposed between a first terminal and a second terminal, a coupling line including a first end terminal and a second end terminal, and configured to be coupled to the signal line to extract a forward coupling signal from the signal line in a forward coupling mode and to extract a reverse coupling signal from the signal line in a reverse coupling mode, a switching circuit configured to connect, in the forward coupling mode, the first end terminal and a coupling port to each other, and connect the second end terminal and a first isolation port to each other to extract the forward coupling signal from the signal line, and configured to connect, in the reverse coupling mode, the second end terminal and the coupling port to each other, and connect the first end terminal and the second isolation port to each other to extract the reverse coupling signal from the signal line, and a phase compensating circuit configured to compensate for a phase difference between the coupling port and the first isolation port in the forward coupling mode, and compensating for a phase difference between the coupling port and the second isolation port in the reverse coupling mode.

The switching circuit may include a first switch connected between the first end terminal and the coupling port, a second switch connected between the second end terminal and the coupling port, a third switch connected between the first end terminal line and the second isolation port, and a fourth switch connected between the second end terminal and the first isolation port.

The phase compensating circuit may include a first compensating circuit connected between the coupling port and the first isolation port and configured to compensate for the phase difference between the coupling port and the first isolation port in the forward coupling mode, and a second compensating circuit connected between the coupling port and the second isolation port and configured to compensate for the phase difference between the coupling port and the second isolation port in the reverse coupling mode.

The first compensating circuit may include a first resistor and a first capacitor connected to each other in series between the coupling port and the first isolation port.

The first compensating circuit further may include a first ground resistor connected between the first isolation port and a first ground terminal.

The second compensating circuit may include a second resistor and a second capacitor connected to each other in series between the coupling port and the second isolation port.

The second compensating circuit further may include a second ground resistor connected between the second isolation port and a second ground terminal.

The phase compensating circuit may include a first ground capacitor connected between the coupling port and the second ground terminal, and a second ground capacitor connected between the coupling port and the first ground terminal.

Other features and aspects will be apparent from the following detailed description, the drawings, and the claims.

Figure 1:
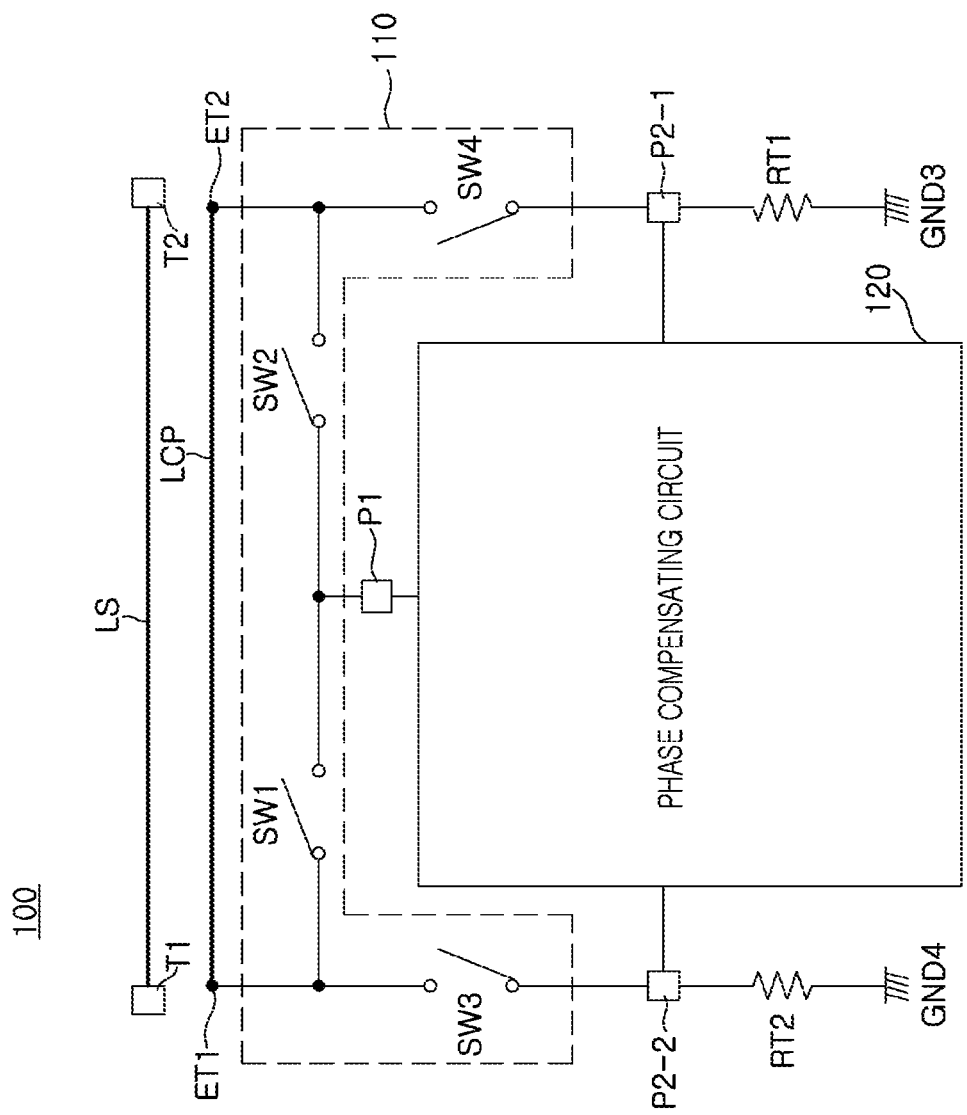
FIG. 1 is a diagram illustrating an example of a coupler circuit in accordance with one or more embodiments.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Unless otherwise defined, all terms, including technical and scientific terms, used herein have the same meaning as commonly understood by one of ordinary skill in the art to which this disclosure pertains after an understanding of the present disclosure. Terms, such as those defined in commonly used dictionaries, are to be interpreted as having a meaning that is consistent with their meaning in the context of the relevant art and the present disclosure, and are not to be interpreted in an idealized or overly formal sense unless expressly so defined herein.

Figure 2:
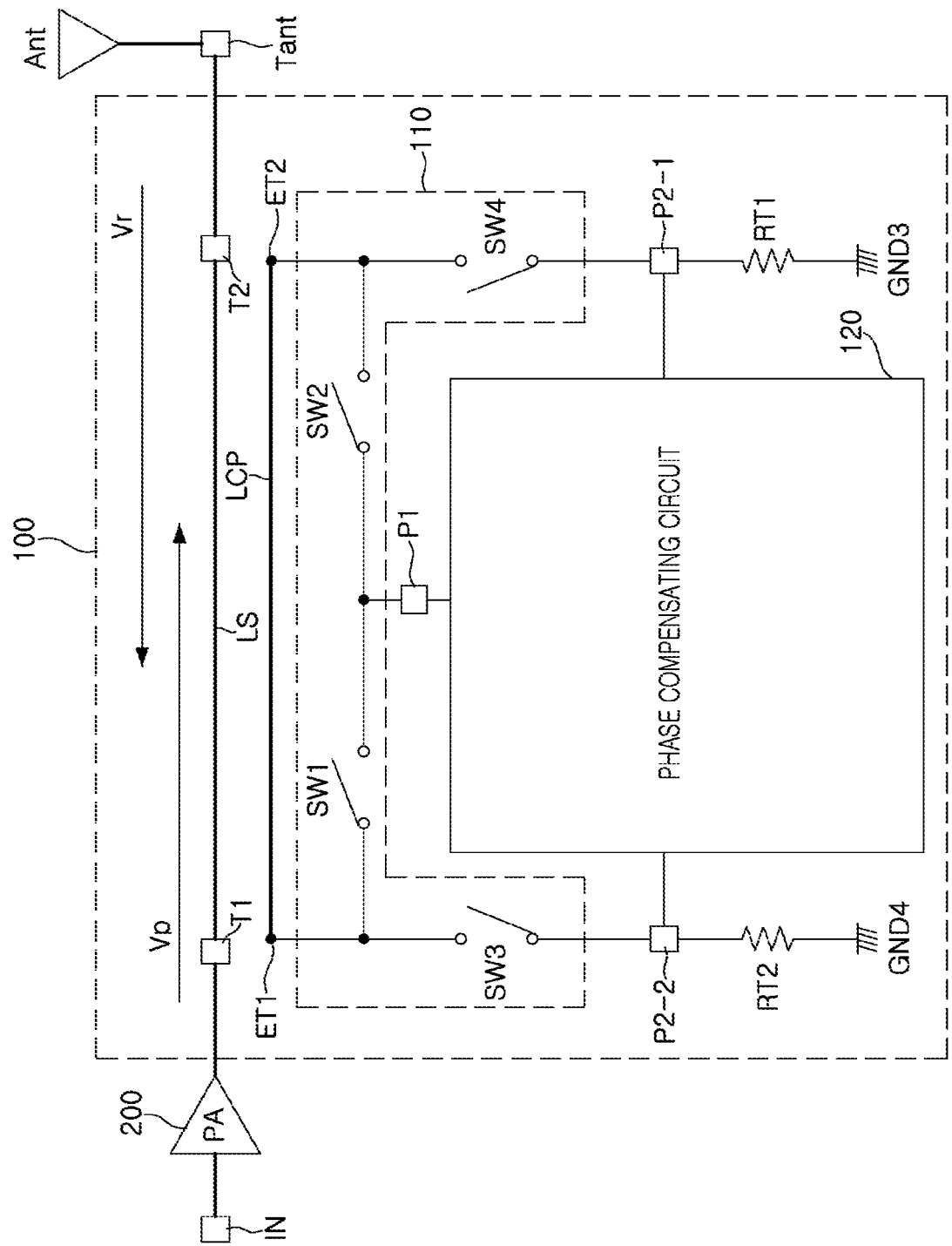
FIG. 2 is a diagram illustrating an example of a power amplifying device in accordance with one or more embodiments.

FIG. 1 is a diagram illustrating an example of a coupler circuit in accordance with one or more embodiments and FIG. 2 is a diagram illustrating an example of a power amplifying device in accordance with one or more embodiments.

Referring to FIGS. 1 and 2, a coupler circuit 100 according to an example may include a signal line LS, a coupling line LCP, a switching circuit 110, and a phase compensating circuit 120.

In a non-limiting example, the signal line LS may be a conductive line disposed between a first terminal T1 and a second terminal T2. As an example, the signal line LS may be connected to an output of a power amplifier, or may be connected to a signal line between an antenna switch and an antenna, or may be connected to a signal line between the power amplifier and the antenna switch. The signal line LS is not limited thereto, but may be applied to a signal line that requires a signal detection.

In a non-limiting example, the coupling line LCP may be a conductive line including a first end terminal ET1 and a second end terminal ET2, and may be disposed to be coupled to the signal line LS. As an example, the coupling line LCP may extract a first coupling signal Scp1 from the signal line LS in a first coupling mode, and may extract a second coupling signal Scp2 from the signal line LS in a second coupling mode, according to an operation of the switching circuit 110.

As an example, the first coupling signal Scp1 may be a forward coupling signal extracted from a transmission signal, and the second coupling signal Scp2 may be a reverse coupling signal extracted from a reception signal or a reflection signal reflected by an antenna. The first coupling mode may be a forward coupling mode, and the second coupling mode may be a reverse coupling mode.

The switching circuit 110 may connect the first end terminal ET1 of the coupling line LCP and a coupling port P1 to each other to extract the forward coupling signal Scp1 in the first coupling (forward coupling) mode, and may connect the second end terminal ET2 of the coupling line LCP and the coupling port P1 to each other to extract the reverse coupling signal Scp2 in the second coupling (reverse coupling) mode.

For example, the switching circuit 110 may connect the first end terminal ET1 of the coupling line LCP and the coupling port P1 to each other and may connect the second end terminal ET2 of the coupling line LCP and a first isolation port P2-1 to each other to extract the first coupling (forward coupling) signal Scp1 from the signal line LS in the first coupling (forward coupling) mode. Alternatively, the switching circuit 110 may connect the second end terminal ET2 of the coupling line LCP and the coupling port P1 to each other and may connect the second end terminal ET2 of the coupling line LCP and the first isolation port P2-1 to each other to extract the second coupling (reverse coupling) signal Scp2 from the signal line LS in the second coupling (reverse coupling) mode.

Meanwhile, the coupling port P1 may be connected to a control circuit, the coupler circuit 100 may include a first termination resistor RT1 and a second termination resistor RT2, and the first termination resistor RT1 may be connected between the first isolation port P2-1 and a ground GND3. The second terminal resistor RT2 may be connected between a second isolation port P2-2 and a ground GND4.

In this example, the coupling signal Scp1 may be transmitted to the control circuit through the coupling port P1.

The phase compensating circuit 120 may compensate for a phase difference between the coupling port P1 and the first isolation port P2-1 in the first coupling (forward coupling) mode. Alternatively, the phase compensating circuit 120 may compensate for a phase difference between the coupling port P1 and the second isolation port P2-2 in the second coupling (reverse coupling) mode.

The phase compensating circuit 120 may be connected to the coupling port P1 and the first isolation port P2-1, and may be connected to the coupling port P1 and the second isolation port P2-2, to reduce a change in a coupling amount of the signals through the signal line LS according to a change in a frequency band, thereby maintaining a uniform coupling amount even in the example of the change in the frequency band.

In addition, the phase compensating circuit 120 may reduce the phase difference between the coupling port P1 and the first isolation port P2-1, and the phase difference between the coupling port P1 and the second isolation port P2-2. As an example, as the phase difference between the coupling port P1 and the first isolation port P2-1 may be smaller than the phase difference between the coupling port P1 and the second isolation port P2-2, the coupling amount due to the reflected wave may be reduced, thereby improving directivity.

In an example, the switching circuit 110 may include a first switch SW1, a second switch SW2, a third switch SW3, and a fourth switch SW4.

In a non-limiting example, the first switch SW1 may be connected between the first end terminal ET1 of the coupling line LCP and the coupling port P1. The second switch SW2 may be connected between the second end terminal ET2 of the coupling line LCP and the coupling port P1. The third switch SW3 may be connected between the first end terminal ET1 of the coupling line LCP and the second isolation port P2-2. The fourth switch SW4 may be connected between the second end terminal ET2 of the coupling line LCP and the first isolation port P2-1.

Referring to FIG. 2, as an example, in an example in which the coupler circuit is included in a power amplifying device, the power amplifying device may include a coupler circuit 100 and a power amplifier 200. An output terminal of the power amplifier 200 may be connected to the first terminal T1 of the signal line LS, and an antenna terminal Tant may be connected to the second terminal T2 of the signal line LS. The antenna terminal Tant may also be connected to an antenna Ant.

In addition, in FIG. 2, Vp is an output voltage output from the power amplifier (PA), and Vr is a voltage Vr of a reflection wave reflected by the antenna.

In FIGS. 1 and 2, each of the first switch SW1, the second switch SW2, the third switch SW3, and the fourth switch SW4 may include at least one switch element. In an example, all of the first switch SW1, the second switch SW2, the third switch SW3, and the fourth switch SW4 may be constituted by the same type of MOS transistors (all NMOS transistors or all PMOS transistors). In this example, when a control signal for controlling the first switch SW1 and the fourth switch SW4 is a switching-on signal, a control signal for controlling the second switch SW2 and the third switch SW3 may be a switching-off signal, or vice versa.

In another non-limiting example, the first switch SW1 and the fourth switch SW4 may be the NMOS transistors and the second switch SW2 and the third switch SW3 may be the PMOS transistors, or vice versa. In this example, the signals for controlling the first switch SW1, the second switch SW2, the third switch SW3, and the fourth switch SW4 may be control signals of the same phase.

Figure 3:
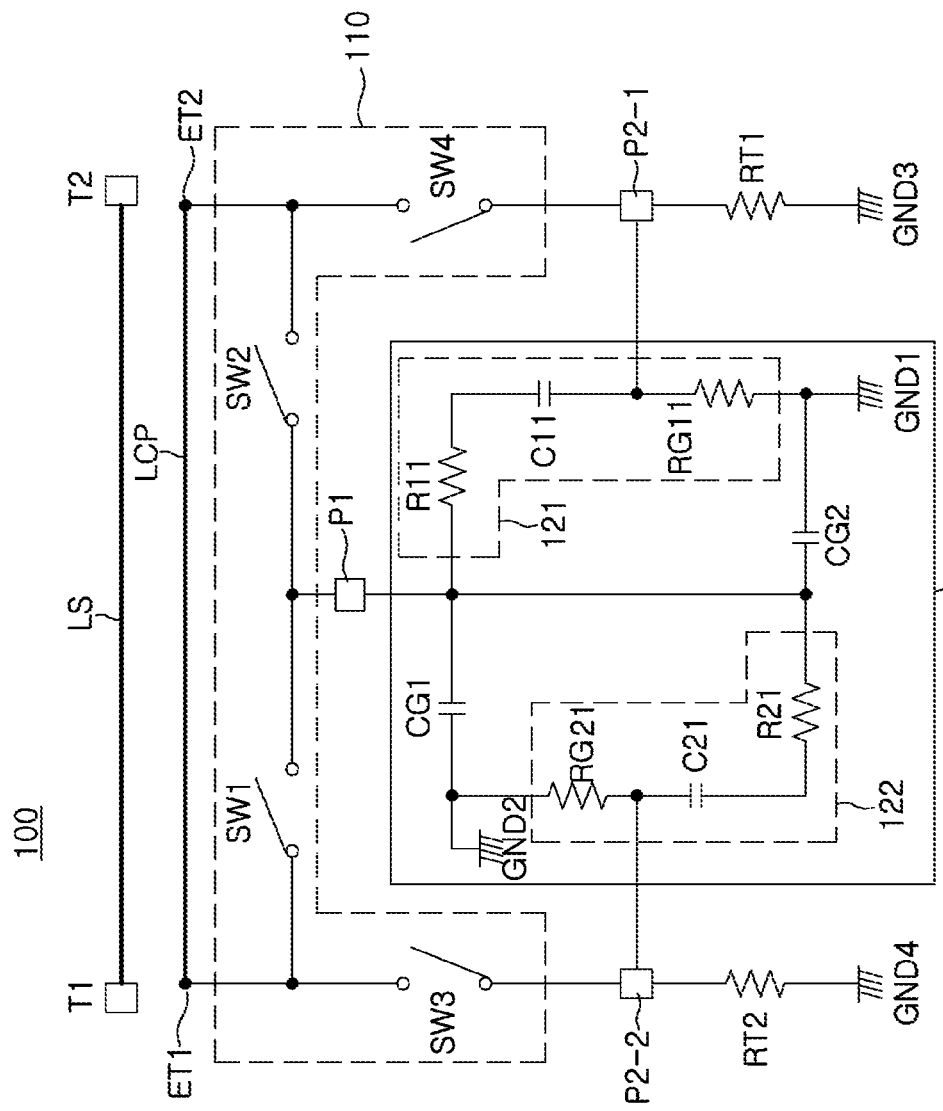
FIG. 3 is a diagram illustrating an example of a phase compensating circuit in accordance with one or more embodiments.

FIG. 3 is a diagram illustrating an example of a phase compensating circuit in accordance with one or more embodiments.

Referring to FIG. 3, the phase compensating circuit 120 may include a first compensating circuit 121 and a second compensating circuit 122.

In a non-limiting example, the first compensating circuit 121 may be connected between the coupling port P1 and the first isolation port P2-1 to compensate for a phase difference between the coupling port P1 and the first isolation port P2-1 in the first coupling mode.

In a non-limiting example, the second compensating circuit 122 may be connected between the coupling port P1 and the second isolation port P2-2 to compensate for a phase difference between the coupling port P1 and the second isolation port P2-2 in the second coupling mode.

The first compensating circuit 121 may include a first resistor R11 and a first capacitor C11 connected in series with each other between the coupling port P1 and the first isolation port P2-1. The connection between the first resistor R11 and the first capacitor C11 is not limited thereto. The first resistor R11 and the first capacitor C11 may be connected to each other in an opposite order.

The first compensating circuit 121 may contribute to the adjustment of the phase difference between the coupling port P1 and the first isolation port P2-1, and may contribute to maintaining a uniform coupling amount. This will be described with reference to FIGS. 6, 7, and 8.

The first compensating circuit 121 may further include a first ground resistor RG11 connected between the first isolation port P2-1 and a first ground terminal GND1.

The first ground resistor RG11 may contribute to adjustment of the phase difference between the coupling port P1 and the first isolation port P2-1. This will be described with reference to FIGS. 6, 7, and 8.

The second compensating circuit 122 may include a second resistor R21 and a second capacitor C21 connected in series with each other between the coupling port P1 and the second isolation port P2-2. The connection between the second resistor R21 and the second capacitor C21 is not limited thereto. The second resistor R21 and the second capacitor C21 may be connected to each other in an opposite order.

The second compensating circuit 122 may contribute to the adjustment of the phase difference between the coupling port P1 and the second isolation port P2-2, and may contribute to maintaining a uniform coupling amount. This will be described with reference to FIGS. 6, 7, and 8.

The second compensating circuit 122 may further include a second ground resistor RG21 connected between the second isolation port P2-1 and a second ground terminal GND2.

The second ground resistor RG21 may contribute to the adjustment of the phase difference between the coupling port P1 and the second isolation port P2-2. This will be described with reference to FIGS. 6, 7, and 8.

In addition, the phase compensating circuit 120 may include a first ground capacitor CG1 connected between the coupling port P1 and the second ground terminal GND2.

The first ground capacitor CG1 may contribute to the adjustment of the phase difference between the coupling port P1 and the first isolation port P2-1 in the forward coupling mode, and may contribute to maintaining a uniform coupling amount. This will be described with reference to FIGS. 6, 7, and 8.

The phase compensating circuit 120 may include a second ground capacitor CG2 connected between the coupling port P1 and the first ground terminal GND1.

The second ground capacitor CG2 may contribute to the adjustment of the phase difference between the coupling port P1 and the second isolation port P2-2 in the reverse coupling mode and may contribute to maintaining a uniform coupling amount. This will be described with reference to FIGS. 6, 7, and 8.

Referring to FIG. 3, the phase compensating circuit may be expressed as a polyphase circuit. As an example, the polyphase circuit may include a closed circuit structure in which resistors and capacitors are repeated.

Figure 4:
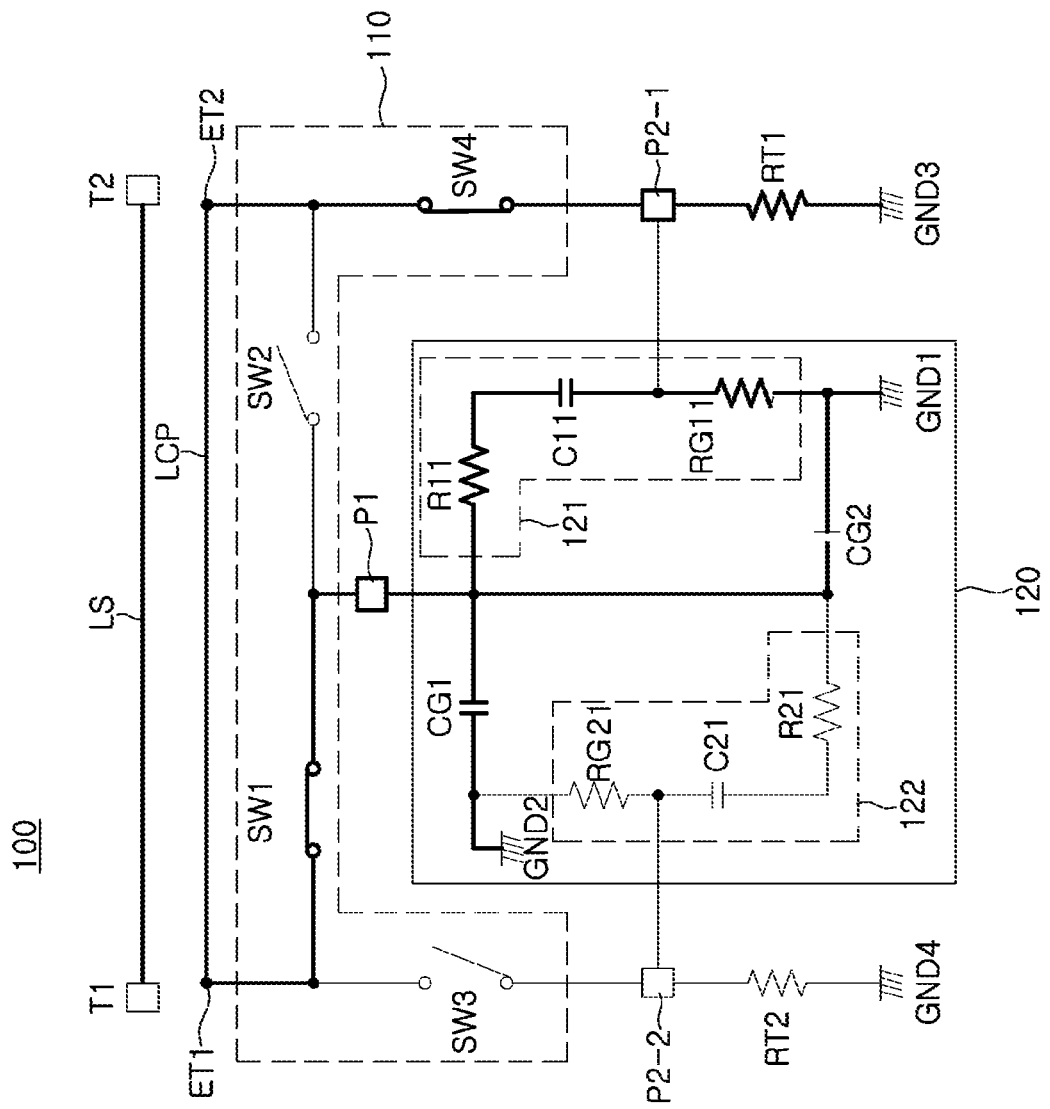
FIG. 4 is a diagram for describing an example of an operation of the coupler circuit in a forward coupling mode in accordance with one or more embodiments.

FIG. 4 is a diagram for describing an operation of the coupler circuit in a forward coupling mode in accordance with one or more embodiments.

Referring to FIG. 4, an operation of the coupler circuit 100 in the forward coupling mode will be described. First, in the forward coupling mode, in the switching circuit 110, the first switch SW1 and the fourth switch SW4 may be switched on, and the second switch SW2 and the third switch SW3 may be switched off.

Accordingly, the first end terminal ET1 of the coupling line LCP and the coupling port P1 may be connected to each other by the first switch SW1 which is switched on, and the second end terminal ET2 of the coupling line LCP and the first isolation port P2-1 may be connected to each other by the fourth switch SW4 which is switched on.

In addition, the forward coupling circuit may include the coupling port P1, the first switch SW1 which is switched on, the coupling line LCP, the fourth switch SW4 which is switched on, and the first termination resistor RT1, which is connected between the first isolation port P2-1 and the third ground GND3. In this example, the first compensating circuit 121 may compensate for the phase difference between the coupling port P1 and the first isolation port P2-1. Accordingly, the forward coupling signal Scp1 extracted by the forward coupling circuit may be phase-compensated by the first compensating circuit 121.

In this example, the first resistor R11, the first capacitor C11, and the first ground resistor RG11 may contribute to adjustment of the phase difference between the coupling port P1 and the first isolation port P2-1 in the forward coupling mode. Since the first ground capacitor CG1 and the second ground capacitor CG2 may bypass some of the coupling amount to the ground according to the change in the frequency band in the forward coupling mode, a coupling level may be uniformly maintained by the first ground capacitor CG1 and the second ground capacitor CG2 even though the frequency band is changed.

In a non-limiting example, as a frequency of the used frequency band is increased, impedance between the signal line and the coupling line may decrease such that a coupling amount from the signal line to the coupling line may be increased, but the first ground capacitor CG1 and the second ground capacitor CG2 may bypass some of the coupling amount corresponding to the coupling amount increased according to the increase in the frequency to the ground.

On the other hand, as the frequency of the used frequency band is decreased, the impedance between the signal line and the coupling line may increase such that the coupling amount from the signal line to the coupling line may be decreased, but the first ground capacitor CG1 and the second ground capacitor CG2 may bypass some of the coupling amount corresponding to the coupling amount decreased according to the decrease in the frequency to the ground.

Accordingly, the first ground capacitor CG1 and the second ground capacitor CG2 in the various examples may adaptively adjust the amount bypassed to the ground even in the example in which the frequency is changed, and as a result, the coupling amount may be maintained at constant. Such a description may be applied to both the forward coupling mode and the reverse coupling mode.

Additionally, in FIGS. 1 and 2, a first ground terminal GND1, a second ground terminal GND2, a third ground terminal GND3, and a fourth ground terminal GND4 may be grounds which are separated from each other, or in a non-limiting example, may be grounds which are connected to each other, which may be selected according to an environment of a communications system used.

Figure 5:
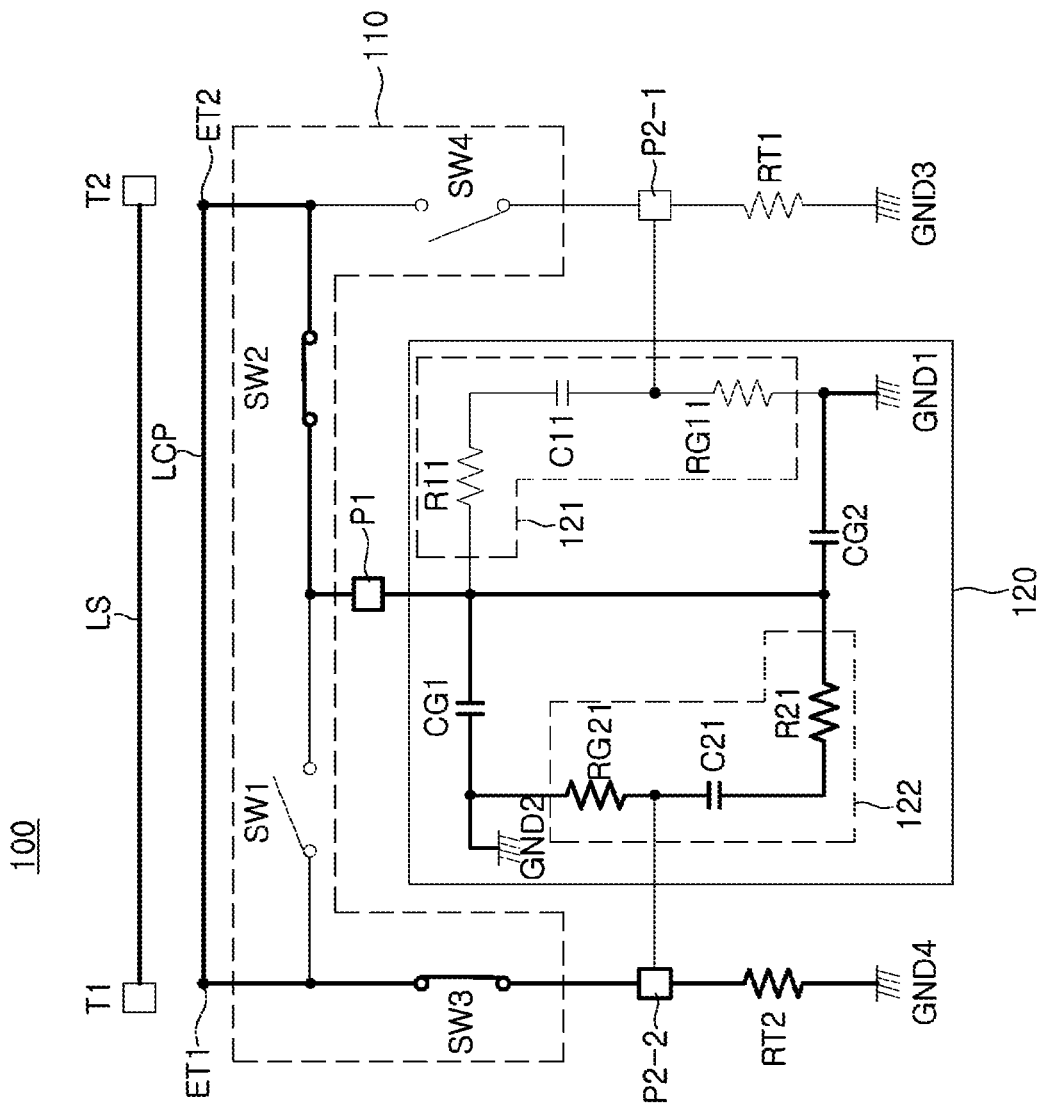
FIG. 5 is a diagram for describing an example of an operation of the coupler circuit in a reverse coupling mode in accordance with one or more embodiments.

FIG. 5 is a diagram illustrating an operation of the coupler circuit in a reverse coupling mode in accordance with one or more embodiments.

Referring to FIG. 5, an operation of the coupler circuit 100 in the reverse coupling mode will be described. First, in the reverse coupling mode, in the switching circuit 110, the second switch SW2 and the third switch SW3 may be switched on, and the first switch SW1 and the fourth switch SW4 may be switched off.

Accordingly, the second end terminal ET2 of the coupling line LCP and the coupling port P1 may be connected to each other by the second switch SW2 which is switched on, and the first end terminal ET1 of the coupling line LCP and the second isolation port P2-2 may be connected to each other by the third switch SW3 which is switched on.

In addition, the reverse coupling circuit may include the coupling port P1, the second switch SW2 which is switched on, the coupling line LCP, the third switch SW3 which is switched on, and the second termination resistor RT2, which is connected between the second isolation port P2-2 and the fourth ground GND4. In this example, the second compensating circuit 121 may compensate for the phase difference between the coupling port P1 and the second isolation port P2-2. Accordingly, the reverse coupling signal Scp2 extracted by the reverse coupling circuit may be phase-compensated by the second compensating circuit 122.

In this example, the second resistor R21, the second capacitor C21, and the second ground resistor RG21 may contribute to the adjustment of the phase difference between the coupling port P1 and the second isolation port P2-2 in the reverse coupling mode. Since the first ground capacitor CG1 and the second ground capacitor CG2 may bypass some of the coupling amount to the ground according to the change in the frequency band in the reverse coupling mode, a coupling level may be uniformly maintained by the first ground capacitor CG1 and the second ground capacitor CG2 even though the frequency band is changed.

Figure 6:
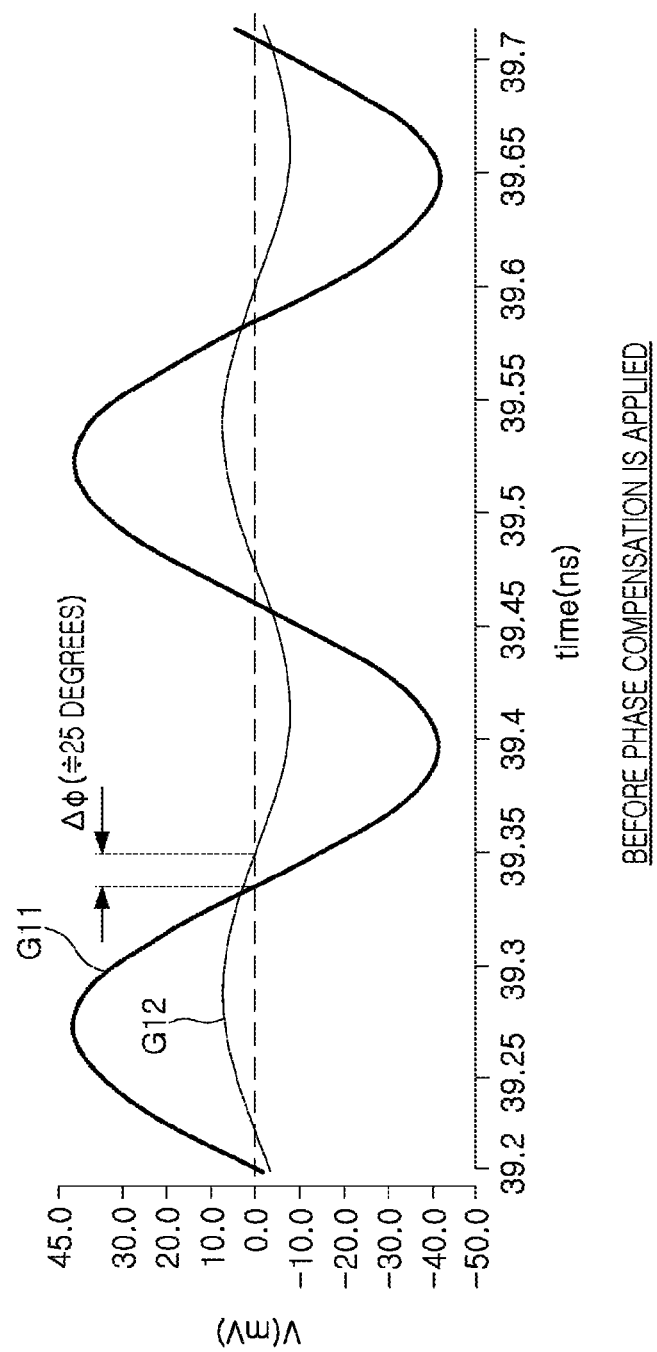
FIG. 6 is a graph illustrating an example of a phase difference between a coupling port and an isolation port before the phase compensating circuit is applied in accordance with one or more embodiments.

FIG. 6 is a graph illustrating an example of a phase difference between a coupling port and an isolation port before the phase compensating circuit is applied in accordance with one or more embodiments.

In FIG. 6, G11 denotes a phase for a signal of an isolation port before the phase compensating circuit is applied, and G12 denotes a phase for a signal of a coupling port before the phase compensating circuit is applied.

Referring to G11 and G12 of FIG. 6, it may be seen that a phase difference ($\Delta\Phi$) between the coupling port and the isolation port before the phase compensating circuit is applied is about 25 degrees (25°).

Figure 7:
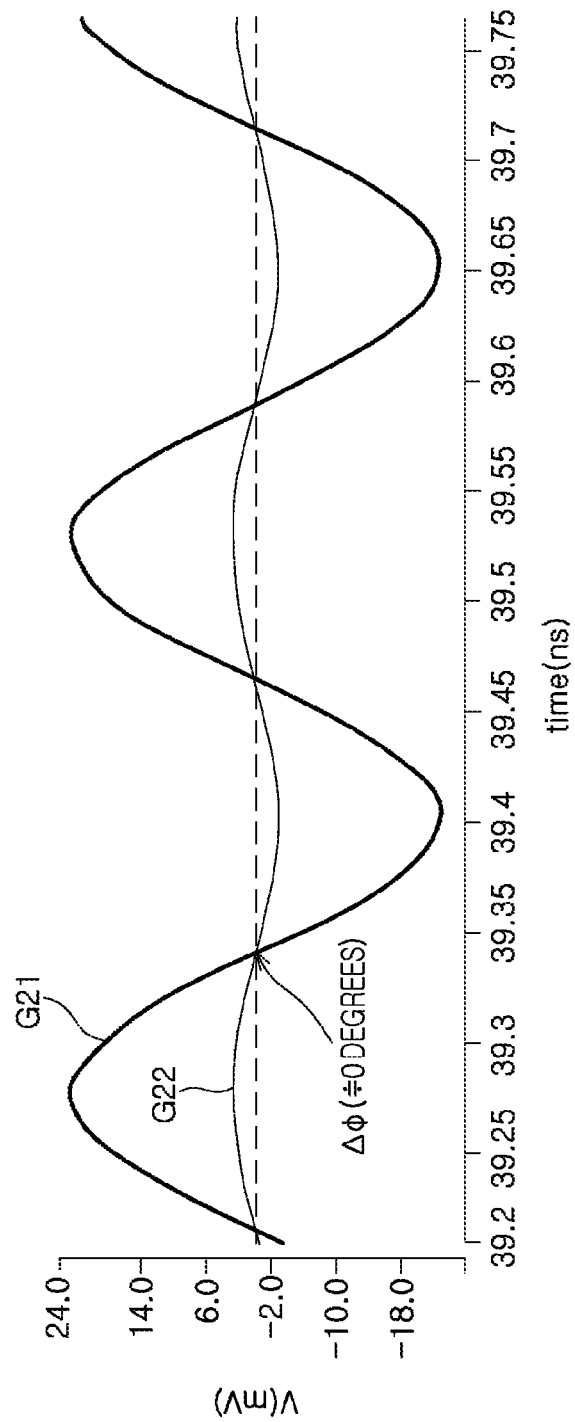
FIG. 7 is a graph illustrating an example of a phase difference between a coupling port and an isolation port after the phase compensating circuit is applied in accordance with one or more embodiments.

FIG. 7 is a graph illustrating an example of a phase difference between a coupling port and an isolation port after the phase compensating circuit is applied in accordance with one or more embodiments.

In FIG. 7, G21 denotes a phase for a signal of an isolation port after the phase compensating circuit is applied, and G22 denotes a phase for a signal of a coupling port after the phase compensating circuit is applied.

Referring to G21 and G22 of FIG. 7, it may be seen that a phase difference ($\Delta\Phi$) between the coupling port and the isolation port after the phase compensating circuit is applied is about 0 degree (0°).

Referring to FIGS. 6 and 7, it may be seen that the phase difference between the coupling port and the isolation port is decreased after the compensating circuit is applied than before the phase compensating circuit is applied.

Figure 8:
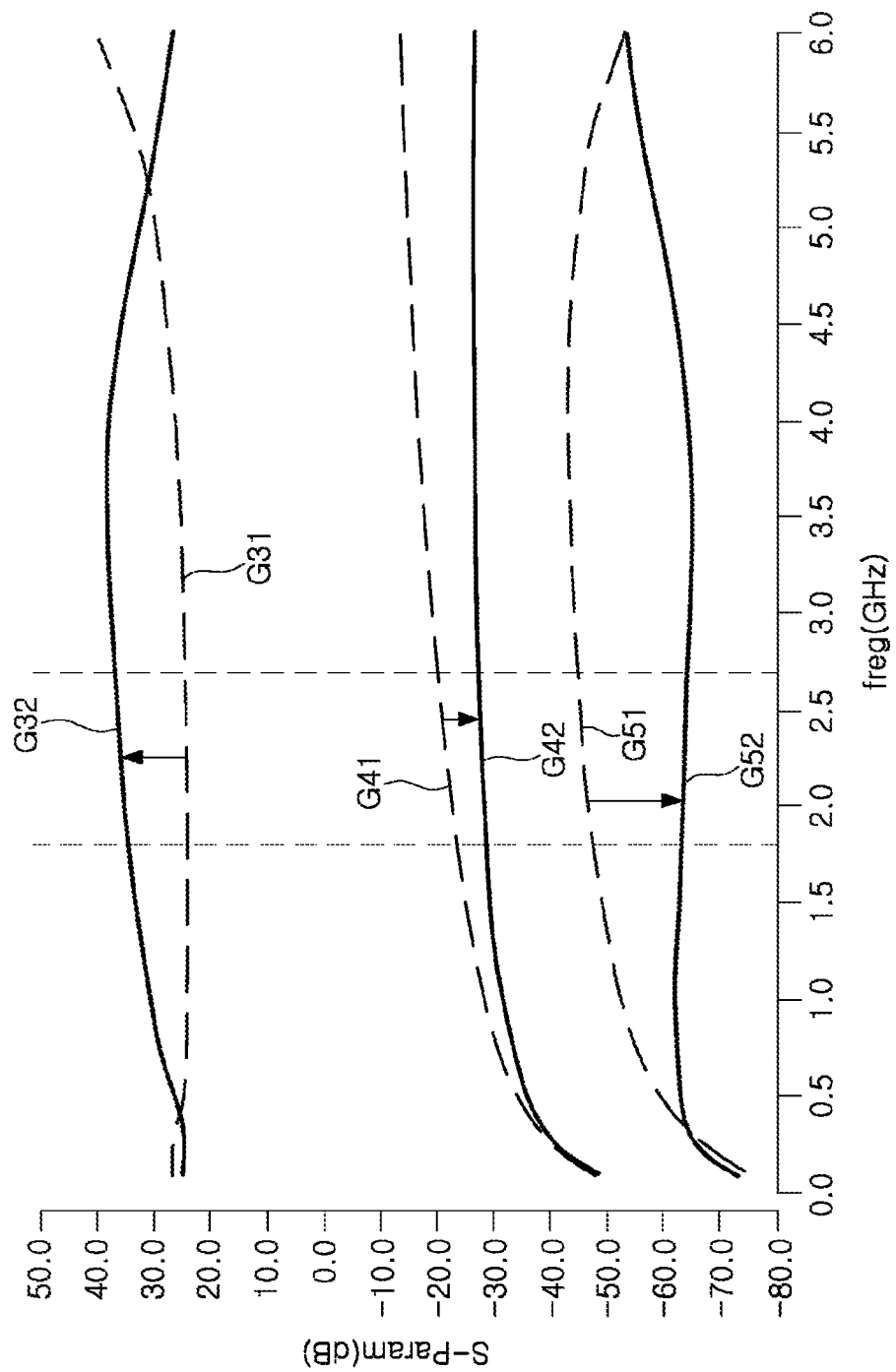
FIG. 8 is a graph illustrating examples of levels of directivity, coupling, and isolation of the coupler circuit in accordance with one or more embodiments.

FIG. 8 is a graph illustrating levels of directivity, coupling, and isolation of the coupler circuit.

In FIG. 8, G31 and G32 are graphs illustrating directivity levels according to whether the phase compensating circuit is not applied, or whether the phase compensating circuit is applied, G41 and G42 are graphs illustrating coupling levels according to whether the phase compensating circuit is not applied, or whether the phase compensating circuit is applied, and G51 and G52 are graphs illustrating isolation levels according to whether the phase compensating circuit is not applied, or whether the phase compensating circuit is applied.

Comparing G31 and G32, it may be seen that the directivity level may be improved in a frequency range of about 0.5 GHz to 5 GHz when the phase compensating circuit is applied. Comparing G41 and G42, it may be seen that the coupling level may be maintained at a constant level in the range of approximately 0.5 GHz to 5 GHz although the used frequency is changed when the phase compensating circuit is applied.

Comparing G51 and G52, it may be seen that the isolation level is reduced in the range of about 0.5 GHz to 5 GHz, which is one of the in-band frequencies when the phase compensating circuit is applied.

Figure 9:
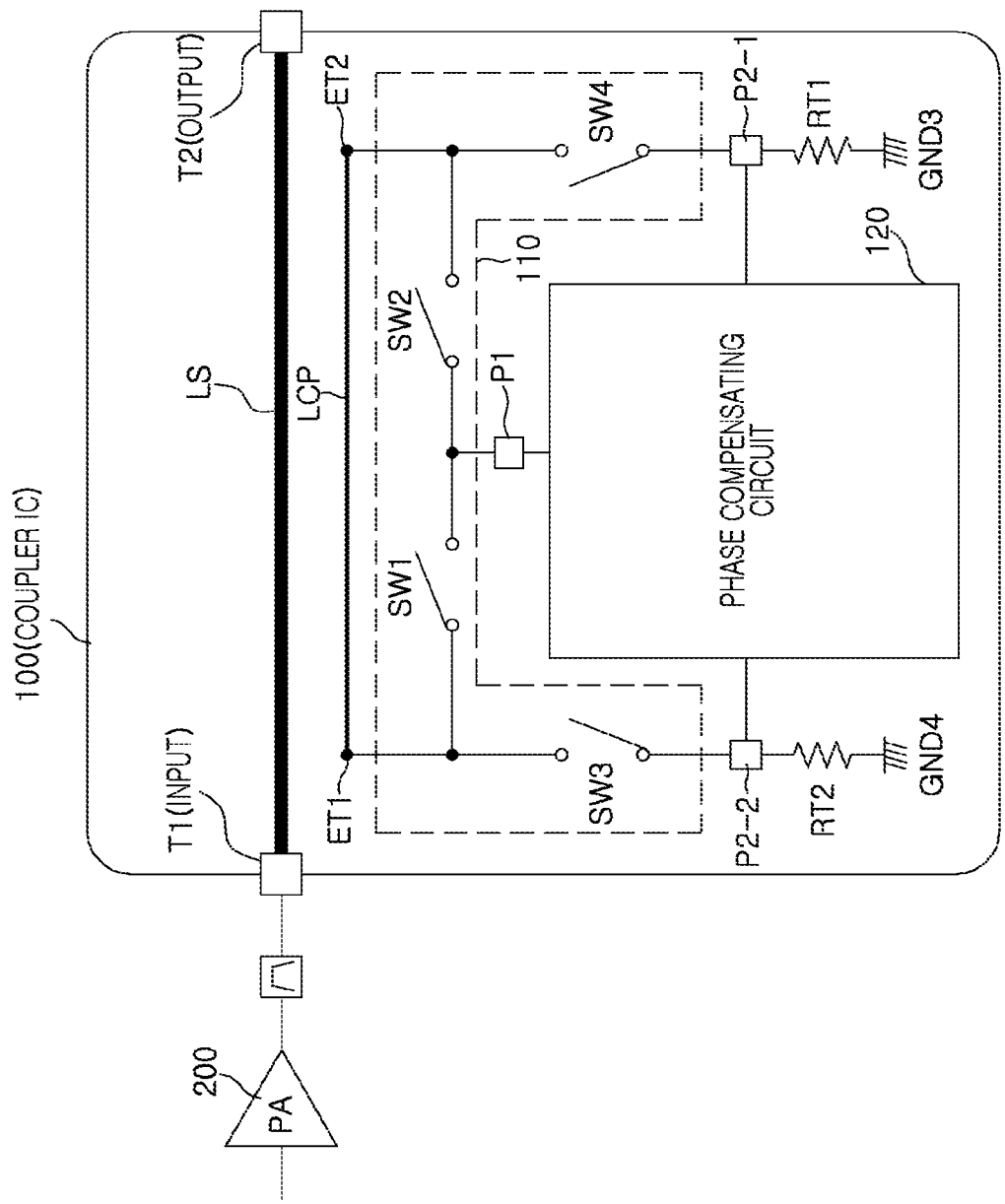
FIG. 9 is a diagram illustrating a first application example of the coupler circuit in accordance with one or more embodiments.

FIG. 9 is a diagram illustrating a first application example of the coupler circuit in accordance with one or more embodiments.

Referring to FIG. 9, one of the coupler circuits illustrated in FIGS. 1 through 5 may be implemented as an integrated circuit (IC) and applied to the output of the power amplifier (PA). In FIG. 9, the phase compensating circuit 120 is illustrated in the coupler circuit, but the coupler circuit is not limited thereto.

Figure 10:
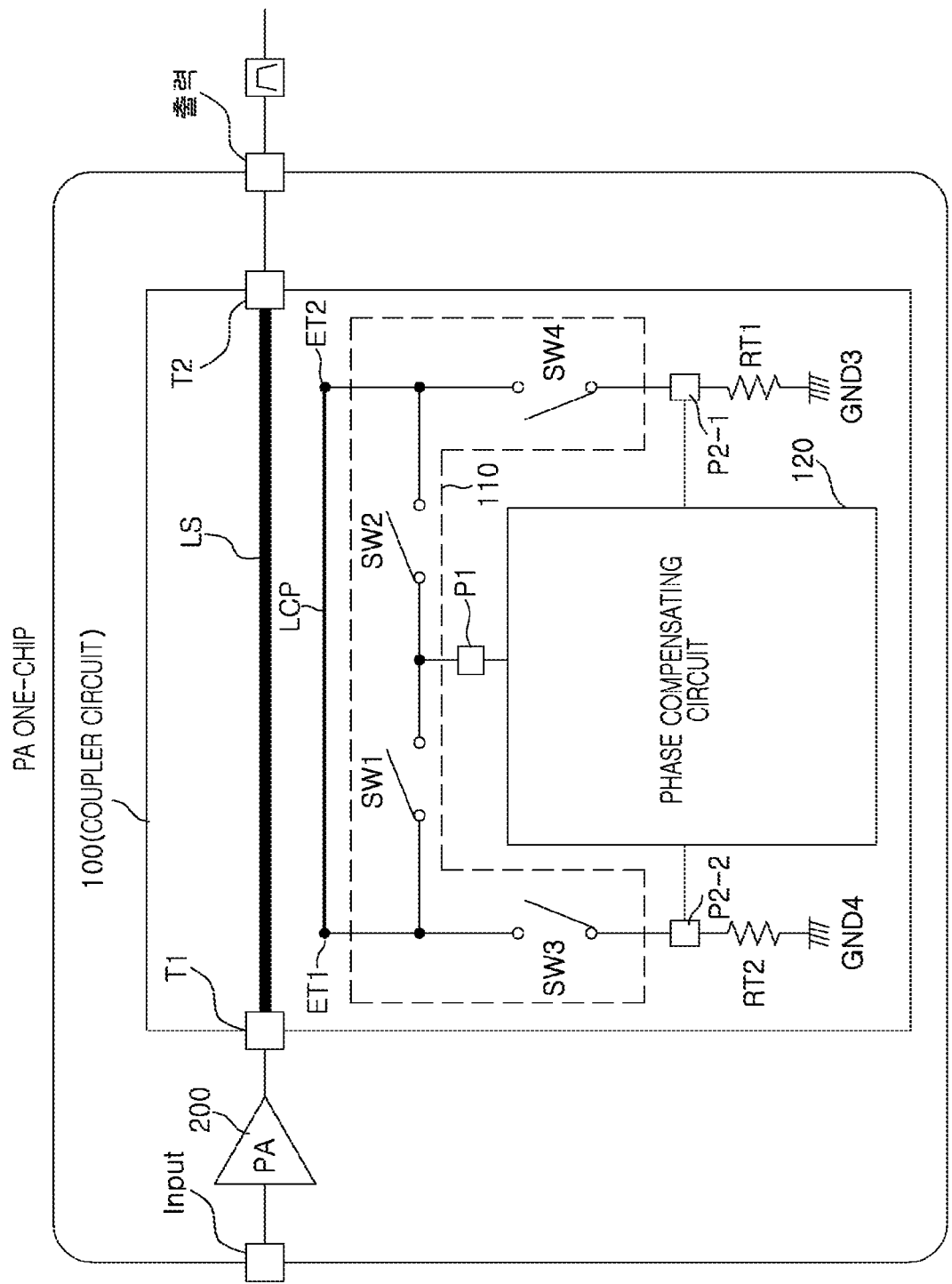
FIG. 10 is a diagram illustrating a second application example of the coupler circuit in accordance with one or more embodiments.

FIG. 10 is a diagram illustrating a second application example of the coupler circuit in accordance with one or more embodiments.

Figure 13:
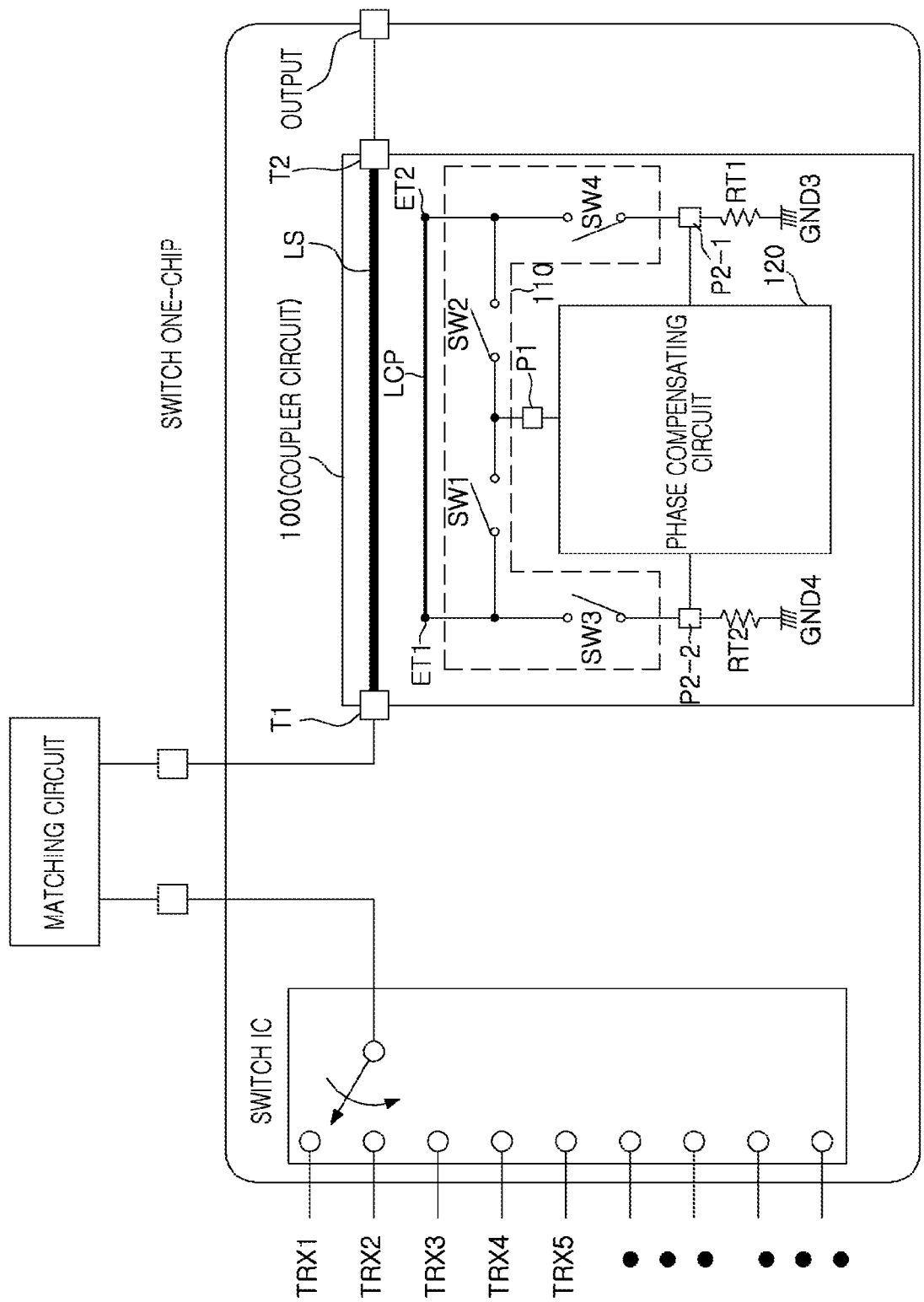
FIG. 13 is a diagram illustrating a fifth application example of the coupler circuit in accordance with one or more embodiments.

Referring to FIG. 10, one of the coupler circuits illustrated in FIGS. 1 through 5 may be applied to be implemented as a PA one-chip together with the power amplifier (PA). In FIG. 13, the phase compensating circuit 120 is illustrated in the coupler circuit, but the coupler circuit is not limited thereto.

Figure 11:
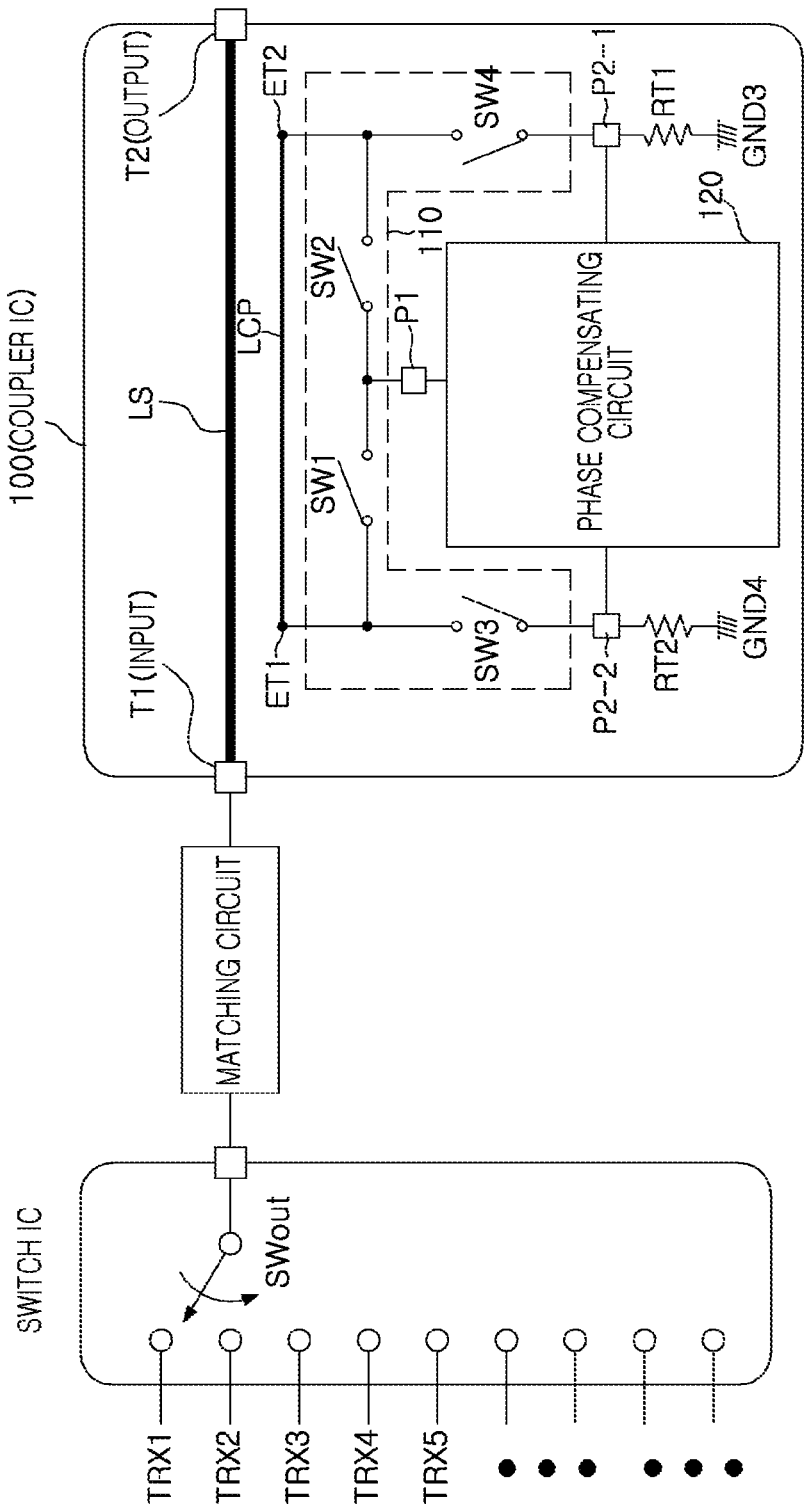
FIG. 11 is a diagram illustrating a third application example of the coupler circuit in accordance with one or more embodiments.

FIG. 11 is a diagram illustrating a third application example of the coupler circuit in accordance with one or more embodiments.

Referring to FIG. 11, one of the coupler circuits illustrated in FIGS. 1 through 5 may be implemented as a coupler integrated circuit (IC) and applied to an output of a switch IC. In this example, a matching circuit may be added between the coupler IC and the switch IC. In FIG. 11, the phase compensating circuit 120 is illustrated in the coupler circuit, but the coupler circuit is not limited thereto.

Figure 12:
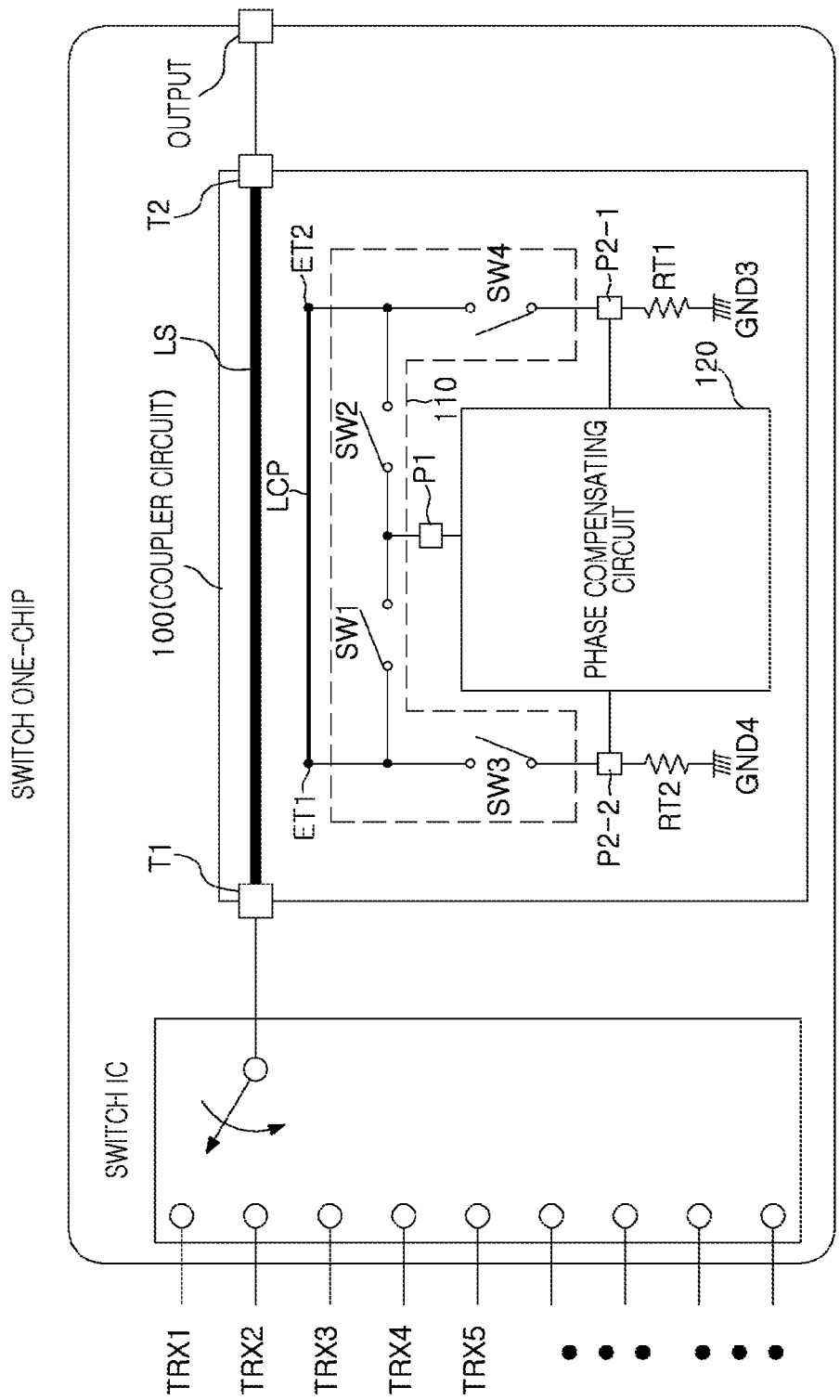
FIG. 12 is a diagram illustrating a fourth application example of the coupler circuit in accordance with one or more embodiments.

FIG. 12 is a diagram illustrating a fourth application example of the coupler circuit in accordance with one or more embodiments.

Referring to FIG. 12, one of the coupler circuits illustrated in FIGS. 1 through 5 may be applied to be implemented as a switch one-chip together with the switching circuit.

FIG. 13 is a diagram illustrating a fifth application example of the coupler circuit in accordance with one or more embodiments.

Referring to FIG. 13, one of the coupler circuits illustrated in FIGS. 1 through 5 may be applied to be implemented as a switch one-chip together with the switching circuit. In FIG. 13, a matching circuit may be included between the switch IC and the coupler circuit.

As set forth above, according to the various examples, the directional coupler circuit including the forward coupling and the reverse coupling may be implemented with one coupling line, may be applied to the power amplifying device or the antenna switch device with the plurality of frequency bands to reduce the change in the coupling amount due to the change in the frequency band and to reduce the coupling amount by the reflected wave, thereby improving directivity and isolation characteristics.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A directional coupler circuit comprising:
   a signal line disposed between a first terminal and a second terminal;
   a coupling line comprising a first end terminal and a second end terminal, and configured to be coupled to the signal line;
   a switching circuit configured to connect the first end terminal and a coupling port to each other to extract a first coupling signal in a first coupling mode, and configured to connect the second end terminal and the coupling port to extract a second coupling signal in a second coupling mode; and
   a phase compensating circuit configured to compensate for a phase difference between the coupling port and a first isolation port in the first coupling mode, or compensate for a phase difference between the coupling port and a second isolation port in the second coupling mode.

2. The directional coupler circuit of claim 1, wherein the switching circuit comprises:
   a first switch connected between the first end terminal and the coupling port;
   a second switch connected between the second end terminal and the coupling port;
   a third switch connected between the first end terminal and the second isolation port; and
   a fourth switch connected between the second end terminal and the first isolation port.

3. The directional coupler circuit of claim 2, wherein the phase compensating circuit comprises:
   a first compensating circuit connected between the coupling port and the first isolation port and configured to compensate for the phase difference between the coupling port and the first isolation port in the first coupling mode; and
   a second compensating circuit connected between the coupling port and the second isolation port and configured to compensate for the phase difference between the coupling port and the second isolation port in the second coupling mode.

4. The directional coupler circuit of claim 3, wherein the first compensating circuit comprises a first resistor and a first capacitor connected to each other in series between the coupling port and the first isolation port.

5. The directional coupler circuit of claim 4, wherein the first compensating circuit further comprises a first ground resistor connected between the first isolation port and a first ground terminal.

6. The directional coupler circuit of claim 5, wherein the second compensating circuit comprises a second resistor and a second capacitor connected to each other in series between the coupling port and the second isolation port.

7. The directional coupler circuit of claim 6, wherein the second compensating circuit further comprises a second ground resistor connected between the second isolation port and a second ground terminal.

8. The directional coupler circuit of claim 7, wherein the phase compensating circuit comprises:
a first ground capacitor connected between the coupling port and the second ground terminal; and
a second ground capacitor connected between the coupling port and the first ground terminal.

9. A power amplifying device comprising:
a power amplifier; and
a directional coupler circuit connected to an output terminal of the power amplifier,
wherein the directional coupler circuit comprises:
a signal line disposed between a first terminal and a second terminal;
a coupling line comprising a first end terminal and a second end terminal, and configured to be coupled to the signal line to extract a forward coupling signal from the signal line in a forward coupling mode and to extract a reverse coupling signal from the signal line in a reverse coupling mode;
a switching circuit configured to connect, in the forward coupling mode, the first end terminal and a coupling port to each other, and connect the second end terminal and a first isolation port to each other to extract the forward coupling signal from the signal line, and configured to connect, in the reverse coupling mode, the second end terminal and the coupling port to each other, and connect the first end terminal and the second isolation port to each other to extract the reverse coupling signal from the signal line; and
a phase compensating circuit configured to compensate for a phase difference between the coupling port and the first isolation port in the forward coupling mode, and compensating for a phase difference between the coupling port and the second isolation port in the reverse coupling mode.

10. The power amplifying device of claim 9, wherein the switching circuit comprises:
a first switch connected between the first end terminal and the coupling port;
a second switch connected between the second end terminal and the coupling port;
a third switch connected between the first end terminal line and the second isolation port; and
a fourth switch connected between the second end terminal and the first isolation port.

11. The power amplifying device of claim 10, wherein the phase compensating circuit comprises:
a first compensating circuit connected between the coupling port and the first isolation port and configured to compensate for the phase difference between the coupling port and the first isolation port in the forward coupling mode; and
a second compensating circuit connected between the coupling port and the second isolation port and configured to compensate for the phase difference between the coupling port and the second isolation port in the reverse coupling mode.

12. The power amplifying device of claim 11, wherein the first compensating circuit comprises a first resistor and a first capacitor connected to each other in series between the coupling port and the first isolation port.

13. The power amplifying device of claim 12, wherein the first compensating circuit further comprises a first ground resistor connected between the first isolation port and a first ground terminal.

14. The power amplifying device of claim 13, wherein the second compensating circuit comprises a second resistor and a second capacitor connected to each other in series between the coupling port and the second isolation port.

15. The power amplifying device of claim 14, wherein the second compensating circuit further comprises a second ground resistor connected between the second isolation port and a second ground terminal.

16. The power amplifying device of claim 15, wherein the phase compensating circuit comprises:
a first ground capacitor connected between the coupling port and the second ground terminal; and
a second ground capacitor connected between the coupling port and the first ground terminal.

* * * * *